US008448118B2

(12) United States Patent
Graf et al.

(10) Patent No.: US 8,448,118 B2
(45) Date of Patent: May 21, 2013

(54) DETERMINING INTRA-DIE WIREBOND PAD PLACEMENT LOCATIONS IN INTEGRATED CIRCUIT

(75) Inventors: Richard S. Graf, Gray, ME (US); Haruo Itoh, Shiga-ken (JP); Wai Ling Chung-Maloney, Waterbury Center, VT (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 13/032,059

(22) Filed: Feb. 22, 2011

(65) Prior Publication Data

US 2012/0216164 A1    Aug. 23, 2012

(51) Int. Cl.
*G06F 17/50* (2006.01)

(52) U.S. Cl.
USPC ........... 716/120; 716/122; 716/123; 716/125; 716/133

(58) Field of Classification Search
USPC ................. 716/118, 119, 120, 122, 123, 125, 716/132, 133
See application file for complete search history.

(56) References Cited

U.S. PATENT DOCUMENTS

| | | | |
|---|---|---|---|
| 4,811,237 A * | 3/1989 | Putatunda et al. ............ | 716/127 |
| 5,838,072 A | 11/1998 | Li et al. | |
| 6,269,327 B1 | 7/2001 | Bednar et al. | |
| 7,173,328 B2 | 2/2007 | Barber | |
| 7,326,594 B2 | 2/2008 | Beauchamp et al. | |
| 7,646,087 B2 | 1/2010 | Tu et al. | |
| 7,696,631 B2 | 4/2010 | Beaulieu et al. | |
| 2002/0027279 A1 | 3/2002 | Takata et al. | |
| 2004/0178498 A1 | 9/2004 | Low et al. | |
| 2005/0205988 A1 | 9/2005 | Radza | |
| 2011/0107283 A1 * | 5/2011 | Oh et al. ...................... | 716/107 |

OTHER PUBLICATIONS

Amagai et al., "Development of Chip Scale Packages (CSP) for Center Pad Devices", 1997 Electronic Components and Technology Conference.

* cited by examiner

*Primary Examiner* — Sun Lin
(74) *Attorney, Agent, or Firm* — Richard M. Kotulak; Hoffman Warnick LLC

(57) ABSTRACT

Solutions for determining intra-die wirebond pad placement locations in an integrated circuit (IC) die are disclosed. In one embodiment, a method includes generating a dividing band in the IC die, the dividing band dividing the IC die into a first region and a second region; determining a voltage (IR) drop across the first region and the second region; comparing the IR drops across the regions; and in response to the IR drops being substantially unequal, moving the dividing band, determining new IR drops across the regions, and comparing the new IR drops until the IR drops are substantially equal. The dividing band may provide desired locations for intra-die wirebond pads.

20 Claims, 12 Drawing Sheets

(12) United States Patent

DETERMINING INTRA-DIE WIREBOND PAD PLACEMENT LOCATIONS IN INTEGRATED CIRCUIT

BACKGROUND OF THE INVENTION

The subject matter disclosed herein relates to determining placement locations of intra-die wirebond pads in an integrated circuit (IC). More specifically, the subject matter disclosed herein relates to determining placement locations of intra-die wirebond pads in an IC in order to reduce IR (voltage) drop within the IC.

Conventionally, packaging of ICs involves using one of two distinct basic IC packaging approaches, wirebond and C4 flip chip. Generally speaking, wirebond packages are less expensive than C4 flip chip packages. This is primarily because C4 packages are directly attached to the laminate using a fine pitch C4 interconnect. In contrast, wirebond packaging uses the wirebond itself to route from a finer-pad pitch of the chip to a looser-bond pitch of the laminate.

In the case of the C4 flip chip design, the voltage, ground and signal off-chip interconnections can be placed throughout the chip in close proximity to active devices, due to the area-array interconnect technology used by C4 flip chips. As such, the IR drop to an active device in a C4 flip chip design is typically not a major concern.

In contrast, wirebond chips use peripheral interconnect configurations where all the wirebond pads are located on the perimeter of the chip. In the wirebond scenario, IR drop to active devices is generally a concern due to the longer intra-die distance between the wirebond pad and the active devices. This concern may be especially high with respect to the center of the chip.

As silicon technology shrinks in size, the chip operating voltage decreases, and the overall chip current usage increases. Coupled with the growth in die size to accommodate increased functionality, the voltage decrease/current increase may make controlling IR drop difficult.

BRIEF SUMMARY OF THE INVENTION

Solutions for determining intra-die wirebond pad placement locations in an integrated circuit (IC) die are disclosed. In one embodiment, a method includes generating a dividing band in the IC die, the dividing band dividing the IC die into a first region and a second region; determining a voltage (IR) drop across the first region and the second region; comparing the IR drops across the first and second regions; and in response to the IR drops being substantially unequal, moving the dividing band, determining new IR drops across the first and second regions, and comparing the new IR drops from across the first and second regions until the IR drops are substantially equal. The dividing band may provide desired locations for intra-die wirebond pads.

A first aspect of the invention includes: a computer-implemented method of determining intra-die wirebond pad placement locations in an integrated circuit (IC) die, the method including: generating a dividing band in the IC die, the dividing band dividing the IC die into a first region and a second region; determining a voltage drop across the first region and the second region; comparing the voltage drop across the first region with the voltage drop across the second region; and in response to the voltage drop across the first region not being equal to the voltage drop across the second region, iteratively performing the following: moving the dividing band to a new location within the IC die to form a new first region and a new second region; determining the voltage drop across the new first region and the new second region; and comparing the voltage drop across the new first region and the new second region until the voltage drop across the new first region is approximately equal to the voltage drop across the new second region.

A second aspect of the invention includes: a computer system having: at least one computing device configured to determine intra-die wirebond pad placement locations in an integrated circuit (IC) die by performing actions including: generating a dividing band in the IC die, the dividing band dividing the IC die into a first region and a second region; determining a voltage drop across the first region and the second region; comparing the voltage drop across the first region with the voltage drop across the second region; and in response to the voltage drop across the first region not being equal to the voltage drop across the second region, iteratively performing the following: moving the dividing band to a new location within the IC die to form a new first region and a new second region; determining a voltage drop across each of the new first region and the new second region; and comparing the voltage drop across the new first region and the new second region until the voltage drop across the new first region is approximately equal to the voltage drop across the new second region.

A third aspect of the invention includes: a computer program comprising program code embodied in at least one computer-readable storage medium, which when executed, enables a computer system to determine intra-die wirebond pad placement locations in an integrated circuit (IC) die, the method including: generating a dividing band in the IC die, the dividing band dividing the IC die into a first region and a second region; determining a voltage drop across the first region and the second region; comparing the voltage drop across the first region with the voltage drop across the second region; and in response to the voltage drop across the first region not being equal to the voltage drop across the second region, iteratively performing the following: moving the dividing band to a new location within the IC die to form a new first region and a new second region; determining a voltage drop across each of the new first region and the new second region; and comparing the voltage drop across the new first region and the new second region until the voltage drop across the new first region is approximately equal to the voltage drop across the new second region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
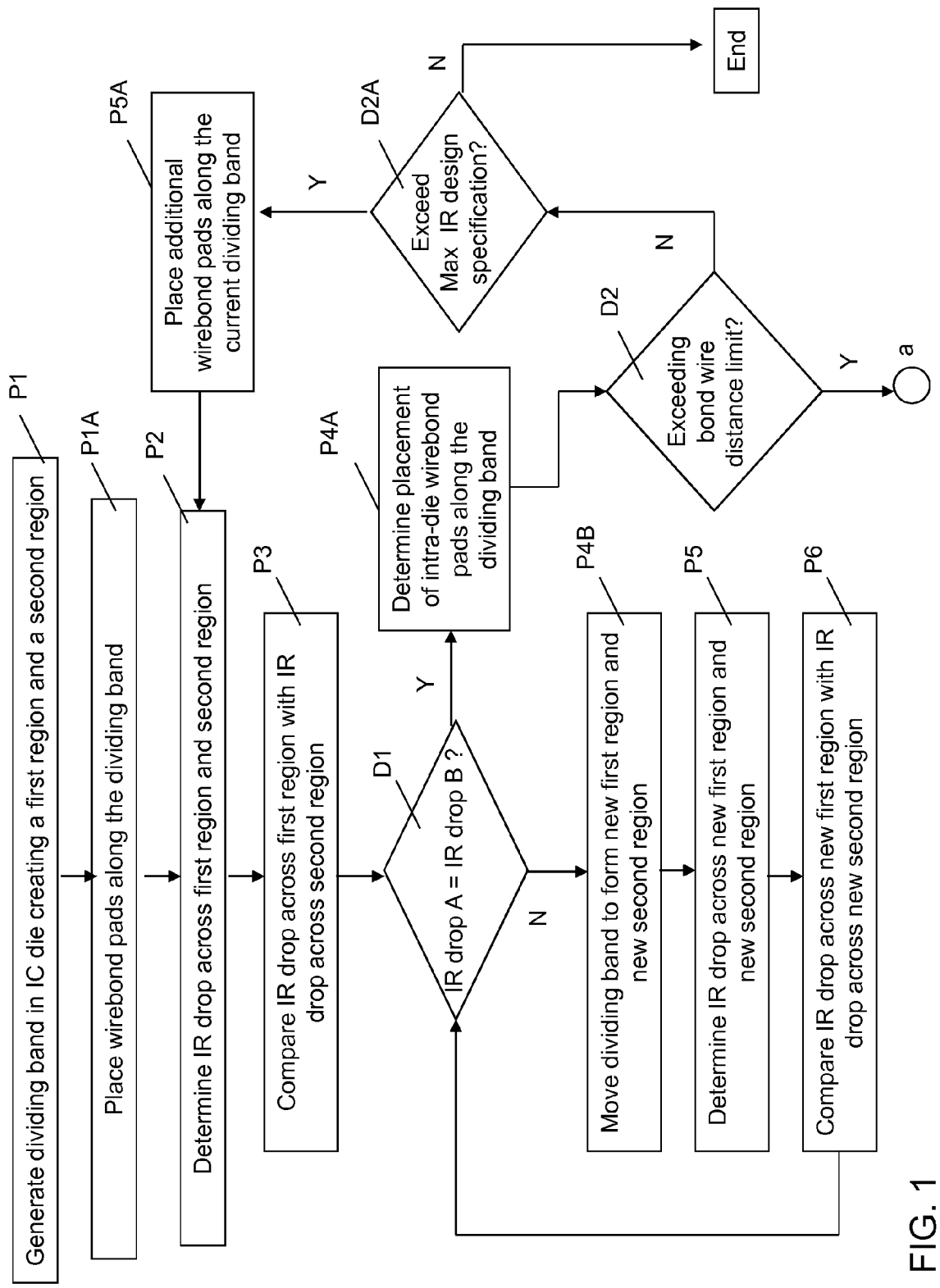
FIG. 1 shows a flow diagram depicting a method according to embodiments.

The subject matter disclosed herein relates to determining placement locations of intra-die wirebond pads in an integrated circuit (IC). More specifically, the subject matter disclosed herein relates to determining placement locations of intra-die wirebond pads in an IC in order to reduce IR (voltage) drop within the IC.

Conventionally, packaging of ICs involves using one of two distinct two basic IC packaging approaches, wirebond and C4 flip chip. Generally speaking, wirebond packages are less expensive than C4 flip chip packages. This is primarily because C4 packages are directly attached to the laminate using a fine pitch C4 interconnect. In contrast, wirebond packaging uses the wirebond itself to route from a finer-pad pitch of the chip to a looser-bond pitch of the laminate. Wirebond chips use peripheral interconnect configurations where all the wirebond pads are located on the perimeter of the chip. In the wirebond scenario, IR drop to active devices is generally a concern due to the longer intra-die distance between the wirebond pad and the active devices. This concern may be especially high with respect to the center of the chip.

As silicon technology shrinks in size, the chip operating voltage decreases, and the overall chip current usage increases. Coupled with the growth in die size to accommodate increased functionality, the voltage decrease/current increase may make controlling IR drop difficult.

Generally speaking, each active device on an integrated circuit chip has a minimum voltage threshold which should be applied to the device in order to meet the device's designed functionality and performance targets. As such, where the applied voltage drops below this threshold (e.g., due to electrical resistance within the chip), performance and functionality of the chip may be negatively impacted. One conventional approach to reduce the electrical resistance on the chip has been to increase the metal width of the power connections from peripheral wire bond pads to the device (or circuit) of concern. A second approach has been to increase the number of back-end-of-the-line (BEOL) wiring layers for the purpose of distributing the voltage and ground connections from the peripheral wire bond pads more robustly throughout the chip.

Both approaches have drawbacks, however. Increasing the metal width, as in the first noted approach, will cause reduced wire porosity. This reduced wire porosity (especially in the shorter line widths and heights of high-performance device nodes such as 65 nm, 45 nm, etc.) will increase the route wiring length, which in turn adds to the resistance of the signal line, thereby negatively impacting performance. The second noted approach, adding BEOL wiring layers to distribute connections to the peripheral wire bond pads, may be effective in reducing the electrical resistance across the chip, however, this approach may be very costly.

In contrast to conventional approaches, aspects of the disclosure provide for adding wirebond pads and bond wires to an integrated circuit chip between the perimeter of the die and the center area of the die in order to reduce IR drop (by providing a lower resistance power and ground path). More specifically, aspects of the disclosure provide for identifying locations for placement of intra-die wirebond pads in order to reduce IR drop.

Turning to FIG. 1, a flow diagram illustrating general processes of determining intra-die wirebond pad placement according to embodiments is shown. It is understood that processes described herein may include references to performing functions "on" or with respect to an integrated circuit (IC), an IC chip and/or an IC die. It is understood that one or more of these processes may be performed on data representing those physical structures. That is, in some embodiments, processes described herein are performed on data representing physical IC structures, where that data may be manipulated according to the processes described herein. That data may then be provided to an IC manufacturer, or fabricator, to create the physical IC structure outlined in the data. In any case, it is understood that the processes described herein may apply to either or both of physical IC structures, or the data representing such structures.

Figure 2:
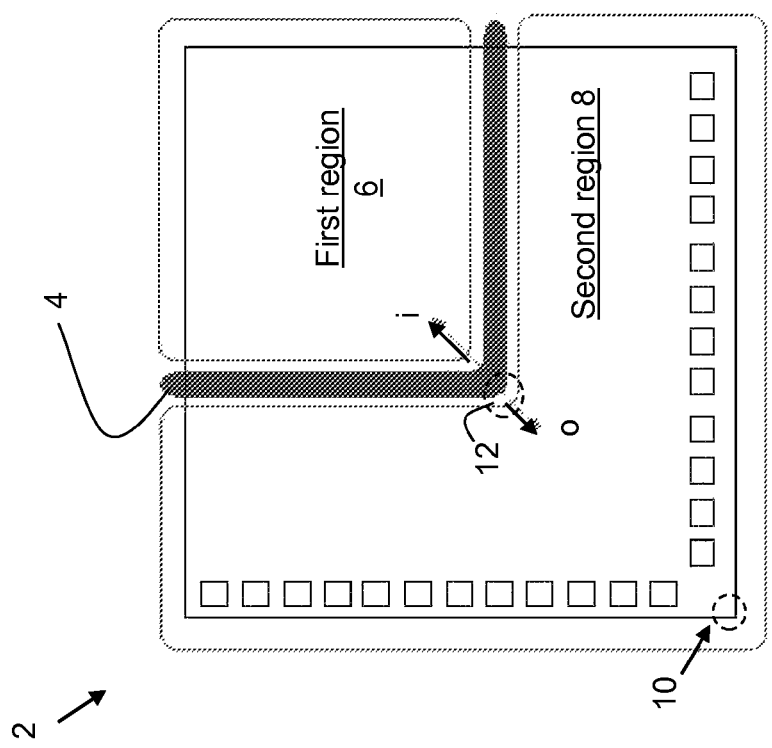
FIG. 2 shows an illustrative depiction of a portion of an integrated circuit chip die according to embodiments.

Returning to FIG. 1, in process P1, a dividing band is generated in an integrated circuit (IC) die creating a first region and a second region within the die. It is understood that in some embodiments, that processes described herein may be performed using only one-quarter of a IC die, as the chip power mesh is assumed to be symmetrical across the entire chip. As shown in FIG. 2, a portion (e.g., one quarter) of an IC die 2 is shown including a dividing band 4, introduced into the IC die 2 in process P1. As shown, IC die 2 has been divided into two regions, a first region 6 and a second region 8. In some embodiments, division of the two regions is performed according to predetermined known criteria, however, in some embodiments, division of regions (placement of dividing band) may be performed arbitrarily. In one embodiment, dividing band 4 may be placed approximately 70% in-board from an edge 10 of the IC die 2, and in a more specific embodiment, dividing band 4 may be placed approximately 85%-90% in-board from the edge 10 of the IC die 2.

In any case, returning to FIG. 1, following initial generation and placement of the dividing band 4, a subsequent (or substantially simultaneous) process P1A may include placing wirebond pads along the dividing band. For example, in one embodiment, process P1A may include placing pairs of Vdd and Gnd wirebond pads along the dividing band. After placing the wirebond pads along the dividing band (P1A), in a subsequent process P2, a voltage (IR) drop across the first region 6 and the second region 8 may be determined. This may be performed according to conventional methods, including using an electrical model to determine the IR drop across first region 6 and second region 8. In one example embodiment, the electrical model approach may include creating (e.g., extracting) an RLC model for each target region (e.g., first region 6 and second region 8), performing an electrical analysis on the models using a circuit simulator, and generating an IR map, indicating the IR drops, based upon the electrical analysis. In any case, following determining of the IR drop across first region 6 and second region 8, the IR drop values across these regions are compared in process P3. In decision D1, if the IR drop in first region 6 is approximately equal to the IR drop in second region 8 (Yes to decision D1), then the dividing band 4 is determined (at least preliminarily) as the placement location for intra-die wire bond pads (process P4A).

In the case that the IR drop in the first region 6 is not approximately equal to the IR drop in the second region 8 (No to decision D1), in process P4B, the dividing band is moved to form a new first region and a new second region (as indicated by arrows "i" for inboard and "o" for outboard in FIG. 2). Subsequent to moving the dividing band (and forming new first and second regions), in process P5, the IR drop across the new first region and new second region may be determined (similarly as performed in process P2). In process P6 (and looping back to decision D1), the IR drop across the new first region and the new second region may be compared to determine whether they are substantially equal. As illustrated, the process of moving the dividing band, determining IR drop across newly established regions, and comparing those IR drops may be repeated until the IR drop in the new first region and the IR drop in the new second region are substantially equal (continuing to process P4A).

Figure 3:
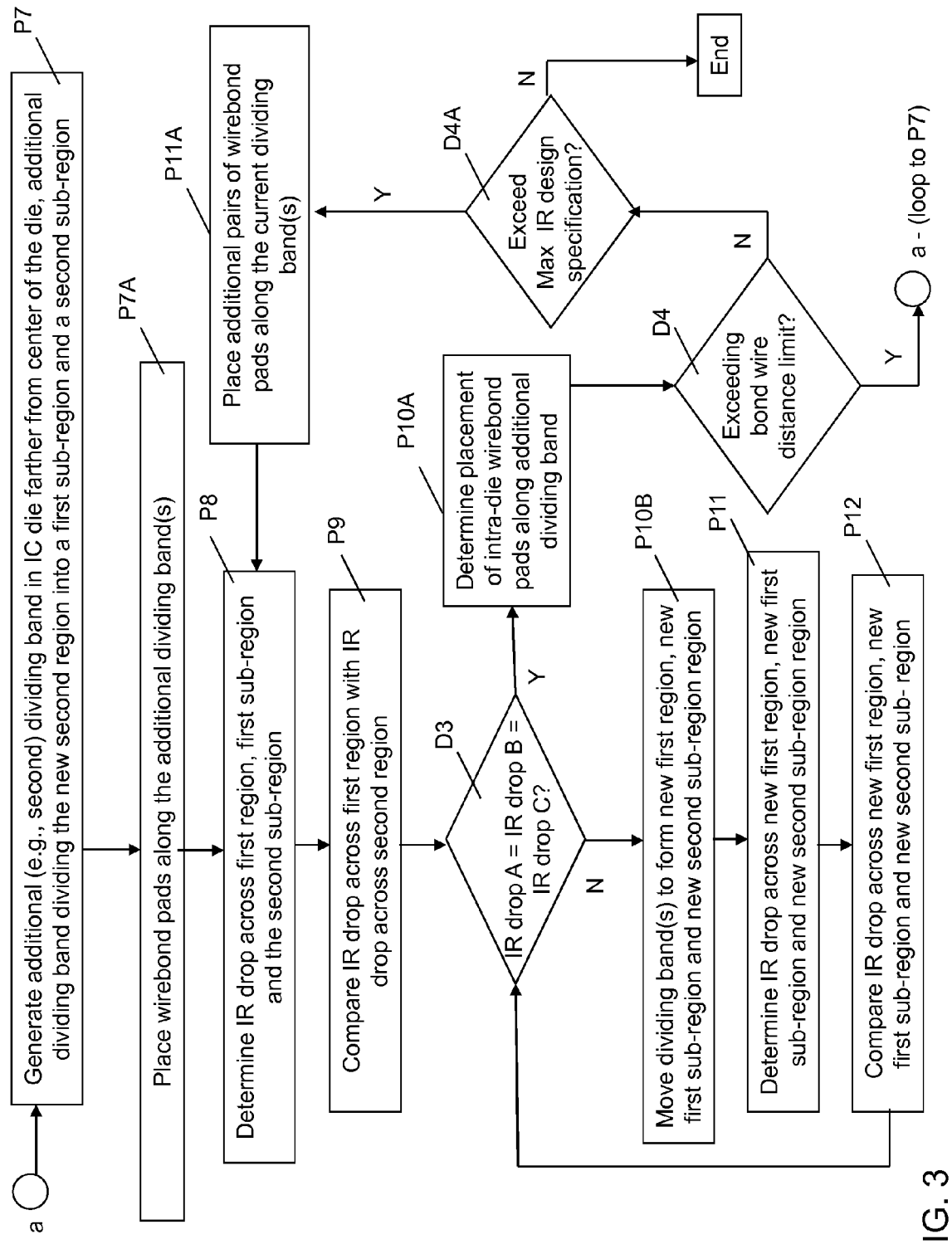
FIG. 3 shows a flow diagram depicting a method according to embodiments.
Figure 4:
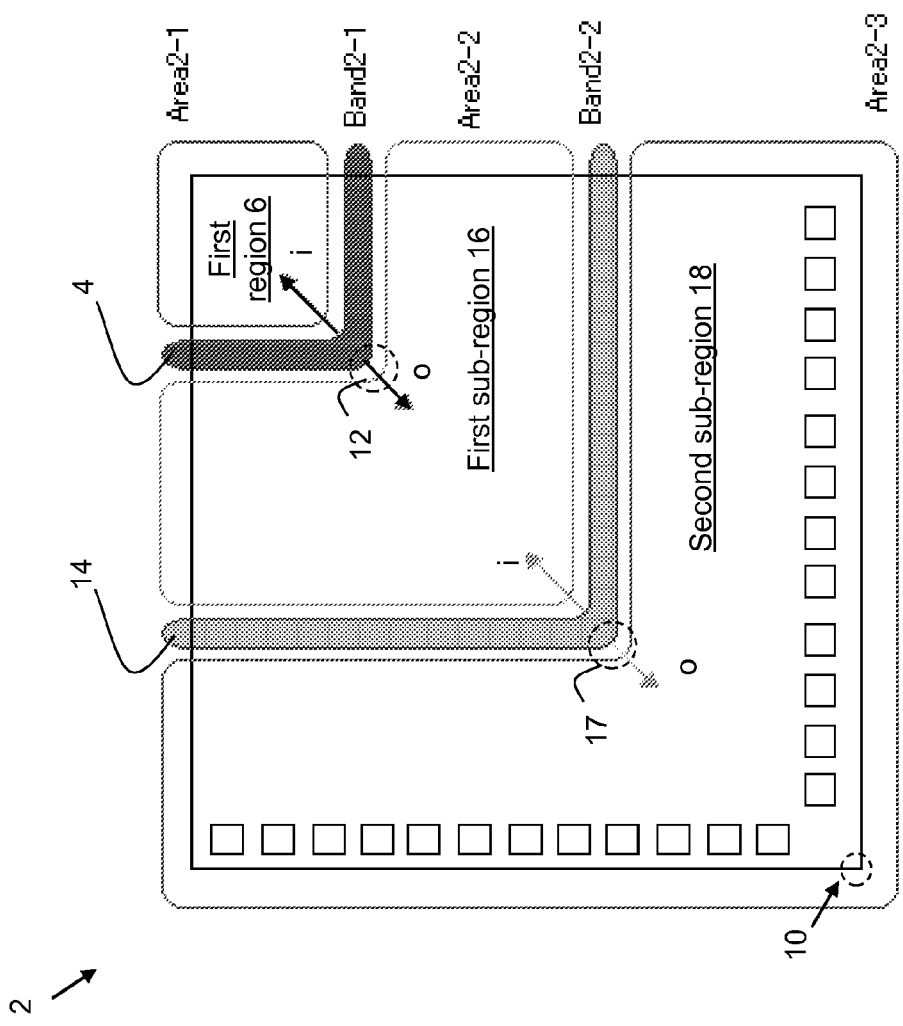
FIG. 4 shows an illustrative depiction of a portion of an integrated circuit chip die according to embodiments.

In some instances, additional processes may be performed after process P4A. For example, as shown in FIG. 1, in response to determining that the IR drop across the new first region and the new second region (or the original first region and the original second region) are substantially equal (Yes to D1), and designating the dividing band as the placement location for the intra-die wirebond pads (process P4A), in decision D2, it is determined whether a wirebond distance limit is exceeded in the IC die 2. That is, a distance (e.g., a straight-line distance) from a corner 12 of an outermost portion of dividing band 4 to the chip edge 10 is measured and compared to a threshold distance associated with a wirebond length (e.g., an acceptable length of wire for a connection between pads, dictated by chip and package design rules). In the case that the wire bond distance limit is exceeded (Yes to decision D2), then the process continues, as indicated in FIG. 3 (moving to connecting node "a"). In the case that the bond wire distance limit is not exceeded (No to decision D2), then in decision D2A, it is determined whether the maximum IR design specifications (e.g., chip and package design specifications) are exceeded by the placement of the pads as determined in P4A. In the case that the maximum IR design specifications are not exceeded (No to decision D2A), the process ends. In the case that the maximum IR design specifications are exceeded (Yes to decision D2A), then in process P5A, intra-die wirebond pads are added along the current band location (either original or modified). In one example, pairs of Vdd and Gnd pads may be added along the current dividing band. Following process P5A, the process may iterate to process P2, where the IR drop across the first and second regions is again determined. It is understood that these processes may be repeated until the design specifications are met As shown in FIG. 3, process P7 (following a positive determination in decision D2), includes generating an additional (e.g., second) dividing band (e.g., second dividing band 14 of FIG. 4) farther from a center of the IC die in the IC die, the second dividing band dividing the new second region into a first sub-region and a second sub-region. This is generally illustrated in FIG. 4, where second dividing band 14 has been formed, parsing previously the previously denoted second region into a first sub-region 16 and a second sub-region 18.

Similarly as described with reference to FIG. 2, following process P7, a subsequent (or substantially simultaneous) process P7A may include placing wirebond pads along the dividing band(s). For example, in one embodiment, process P7A may include placing pairs of Vdd and Gnd wirebond pads along the dividing band(s). After placing the wirebond pads along the dividing band(s) (P7A), a subsequent process P8 may include determining a IR drop across the first region, the first sub-region, and the second sub-region; process P9 may include comparing the IR drop across the first region with each of the IR drops across the first sub-region and the second sub-region, and decision D3 may include determining whether the IR drop in each of the three regions is approximately equal. In the case that the IR drop in each of the three regions is approximately equal, in process P10A, placement locations of intra-die wirebond pads along the additional dividing band are determined. In decision D4, where those placements exceed the bond wire distance limit (Yes to decision D4), the process returns to P7 (indicated by node "a"), where an additional band is generated. It is understood that determining of the bond wire distance between an outer edge (e.g., corner 17 of FIG. 4) of second band 14 and chip edge 10 may be performed according to conventional methods and/or those described herein. In the case that the bond wire distance limit is not exceeded (No to decision D4), then in decision D4A, it is determined whether the maximum IR design specifications (e.g., chip and package design specifications) are exceeded by the placement of the pads as determined in P10A. In the case that the maximum IR design specifications are not exceeded (No to decision D4A), the process ends. In the case that the maximum IR design specifications are exceeded (Yes to decision D4A), then in process P11A, intra-die wirebond pads are added along the current band location(s) (e.g., original or modified locations). For example, in one embodiment, process P11A may include placing pairs of Vdd and Gnd wirebond pads along the dividing band(s). Following process P11A, the process may iterate to process P8, where the IR drop across the first and second regions is again determined. It is understood that these processes may be repeated until the design specifications are met.

Returning to decision D3, in the case that the IR drop across all three regions (first, first sub-region and second sub-region, or region A, B, C) is not equal (No to decision D3), process P10B may include moving at least one of the dividing bands (e.g., dividing band 4 and/or dividing band 14) to a new location within the IC die 2 to form a new first region, a new first sub-region and/or a new second sub-region. Following process P10B, processes P11-P12 and decision D3 may include determining the IR drop across these newly defined regions, e.g., the three newly defined regions (P11), and comparing those IR drops to one another (P12) to determine whether the IR drop for each region is substantially equal (D3). In the case that the IR drop across each of the three regions is not equal, the process may include iteratively moving the dividing band(s) to define new regions (e.g., a subsequent first region, a new first sub-region and/or a new second sub-region), and testing those new regions to determine whether the IR drop across each region is substantially equal to each of the other regions until the IR drop across each region is substantially equal.

Turning to FIGS. 5-12, embodiments of processes of determining intra-die wirebond pad placement in an integrated circuit are described. It is understood that the examples described with reference to FIGS. 5-12 are intended to be illustrative of only some of the various processes that can be performed according to the teachings described herein.

Figure 7:
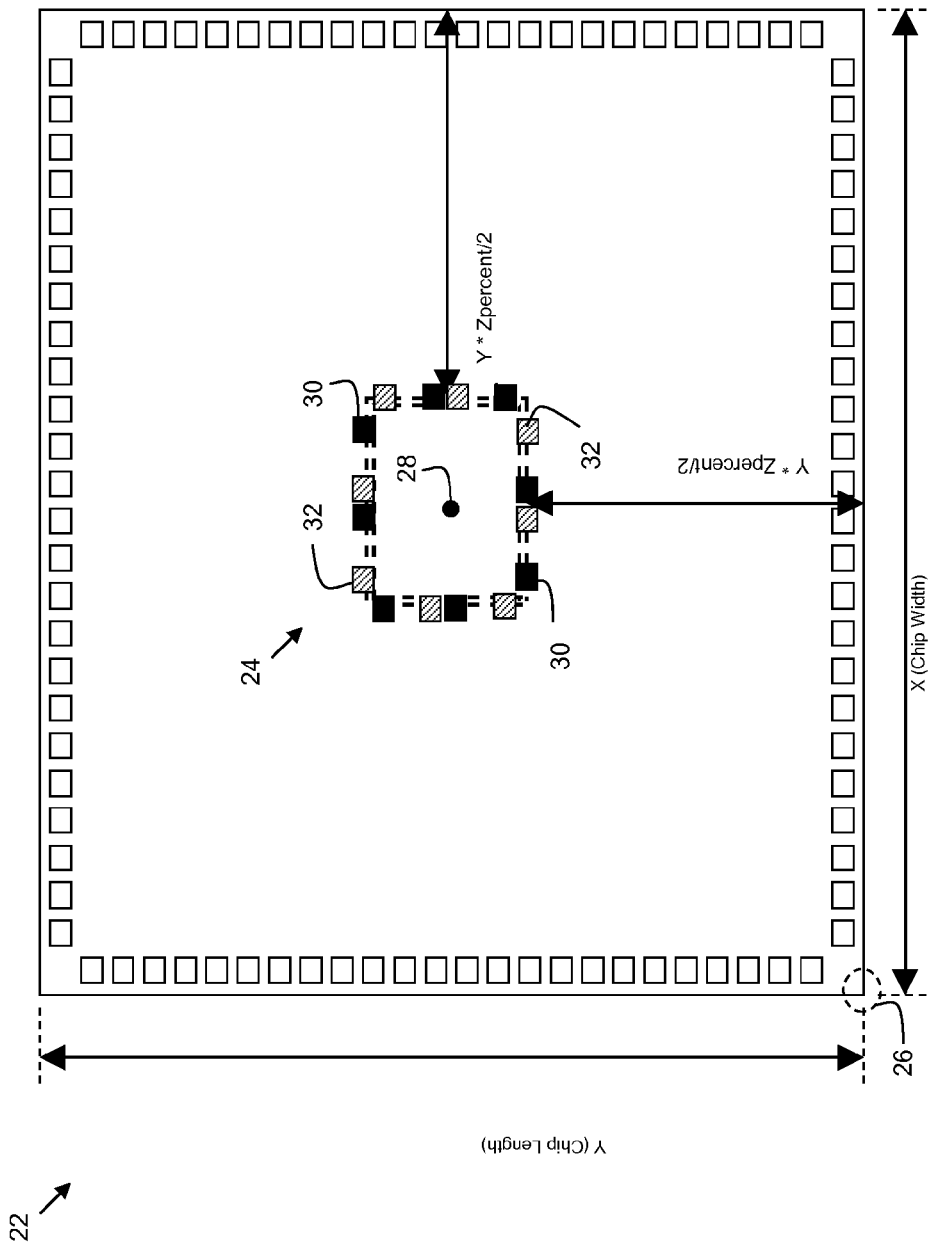
FIG. 7 shows an illustrative depiction of an integrated circuit chip die according to embodiments.
Figure 8:
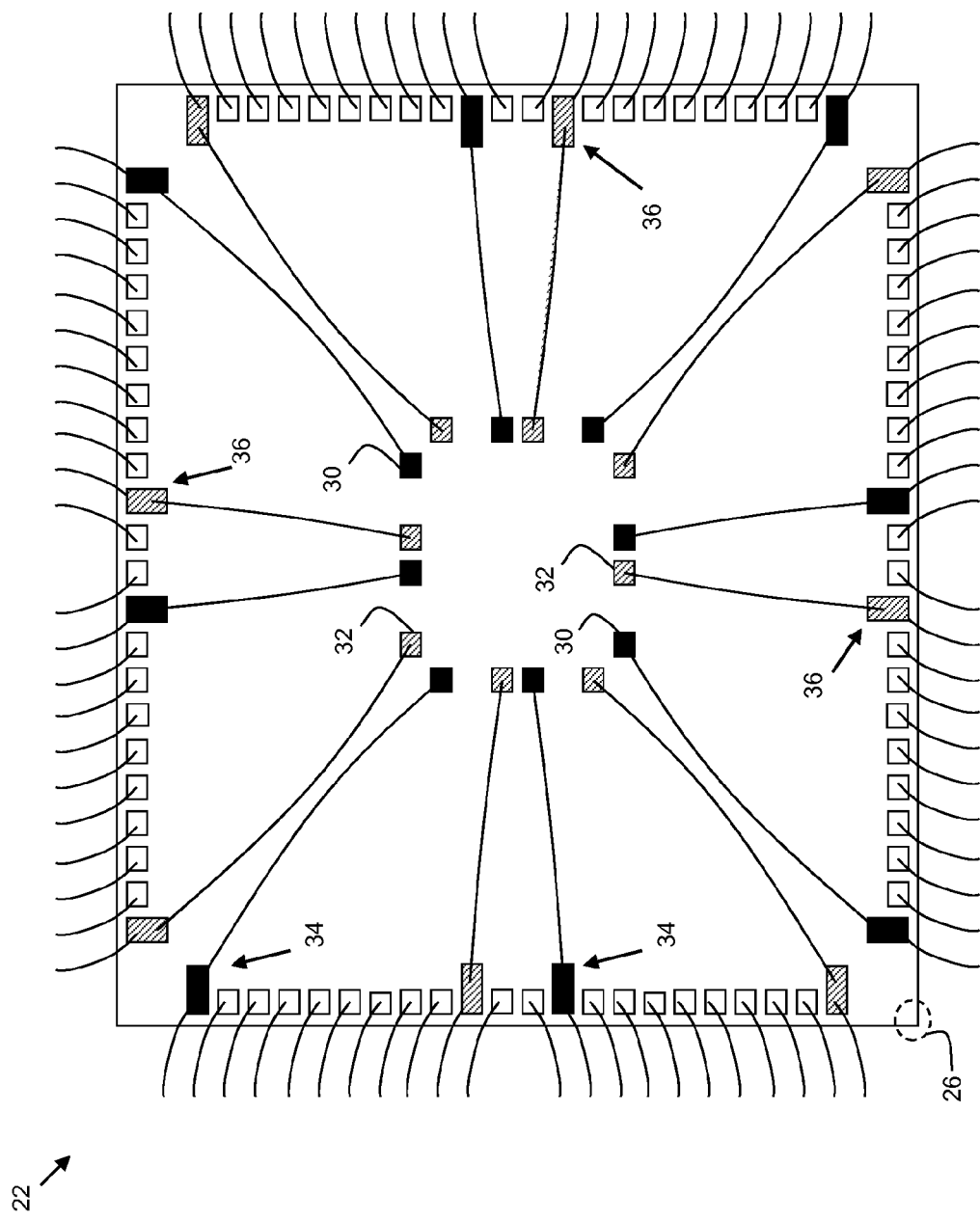
FIG. 8 shows an illustrative depiction of an integrated circuit chip die according to embodiments.
Figure 9:
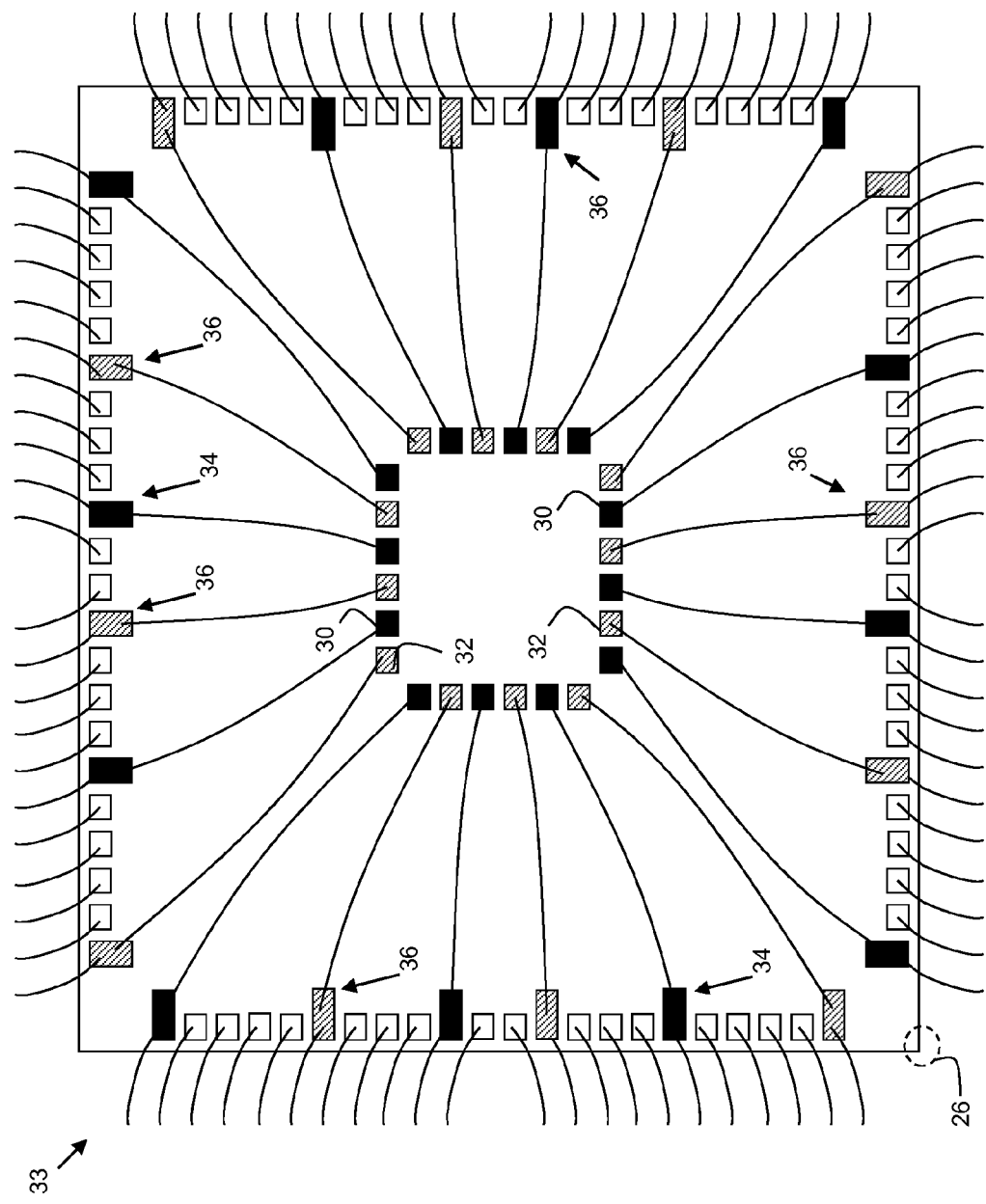
FIG. 9 shows an illustrative depiction of an integrated circuit chip die according to embodiments.

It is further understood that additional figures will be referred to with reference to specific processes described with reference to FIG. 5. That is, FIG. 6 may be referenced with respect to the description of process P21; FIG. 7 may be referenced with respect to the description of process P22; FIG. 8 may be referenced with respect to the description of process P24; FIG. 9 may be referenced with respect to the description of process P25; and FIGS. 10-11 may be referenced with respect to the description of process P26.

Figure 5:
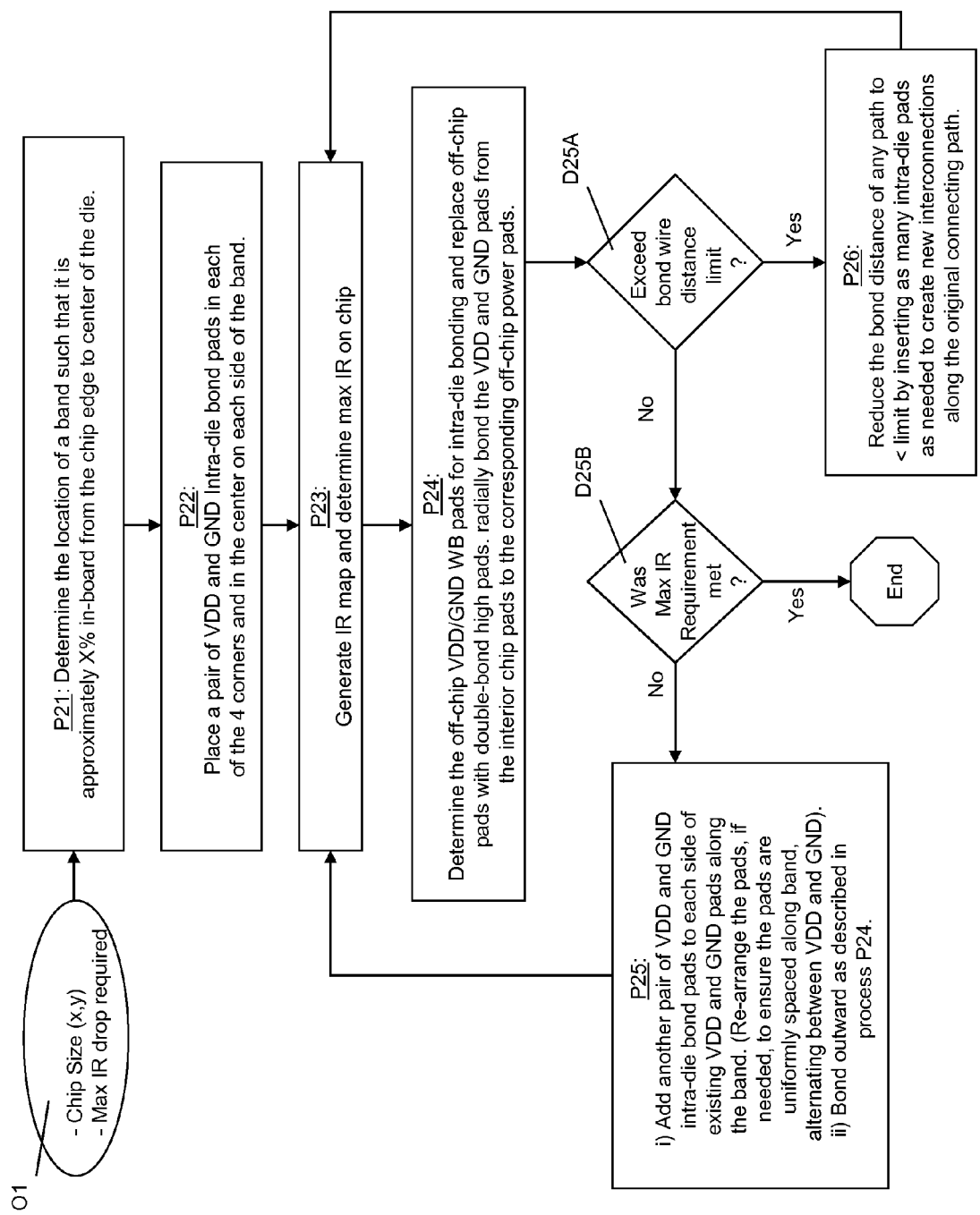
FIG. 5 shows a flow diagram depicting a method according to embodiments.
Figure 6:
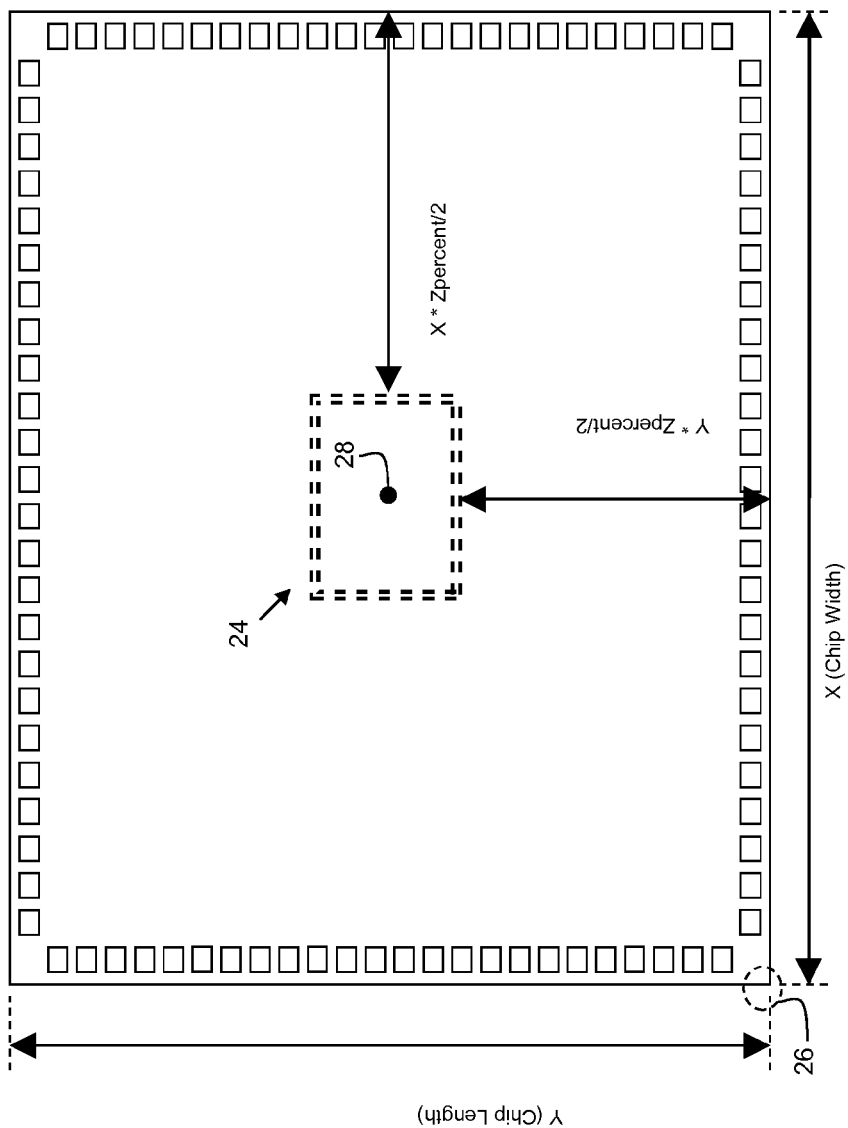
FIG. 6 shows an illustrative depiction of an integrated circuit chip die according to embodiments.

As shown in FIG. 5, object O1 (e.g., a data object) includes data about the size of the die in question, e.g., chip die 22 of FIG. 6, in terms of its length (Y) and width (X). Additionally, object O1 may include data about the maximum IR drop allowable (or, required) across the chip die 22. Process P21 includes determining a location of a band 24 approximately Z percent in-board from the edge 26 of the IC chip die 22 to the center 28 of the die 22. It is understood that the location of band 24 may be at any location in-board from the edge 26 of the IC chip die 22 (e.g., Z may be equal to any percent between approximately one and ninety-nine). In some embodiments, the location of the band 24 may be approximately 50% in-board from the edge of the die 22. In other embodiments, the location of the band 24 may be approximately 75% in-board from the edge 26 of the die 22, and in another embodiment, the location of band 24 may be approximately 85-90% in-board from the edge 26 of the die 22. In some cases, as IR drop will likely be greatest toward the center 28 of the die 22, locating the band 24 approximately 85-90% in-board may be particularly preferred. In process P22 (and illustrated for example in FIG. 7), a pair of source voltage (Vdd) intra-die pads 30 and ground voltage (Gnd) intra-die bond pads 32 are placed in each of the four corners of the band 24, as well as in the center of each side of the band 24. In process P23, an IR (voltage) map (e.g., a design specific IR map) is generated using conventional methods, e.g., using an electrical model, and the IR drop from the off-chip pads (e.g., Vdd and Gnd off-chip pads 34, 36) to the intra-die pads 30, 32 is calculated. Additionally, process P23 may include determining the maximum allowable IR drop on the chip. Following process P23, in process P24, locations of off-chip Vdd pads and off-chip GND pads are determined (based upon connections with Vdd intra-die pads 30 on band 24 and Gnd intra-die pads 32 on band 24, respectively), and those off-chip wirebond pads (Vdd and Gnd) are each replaced with double-bond high pads. For example, off-chip Vdd pads are replaced with double-bond Vdd pads 34 (FIG. 7) and off-chip Gnd pads are replaced with double-bond Gnd pads 36. In one embodiment, this double bonding may be performed radially around the band 24, such that each Vdd intra-die pad 30 and Gnd intra-die pad 32 along the band 24 is connected to a double-bond Vdd pad 34 and double-bond Gnd pad 36, respectively. In decision D25A, it is determined whether the bond wire distance limit is exceeded. Specifically, it is determined whether the location of the intra-die pads 30, 32 violates (exceeds) the wire-bond distance limit. As described herein, in some embodiments, this wire-bond distance limit may be approximately X millimeters. In one example, X may be approximately equal to 2-4 millimeters, and in a more specific embodiment, it may be approximately 3 millimeters. It is understood that the wire-bond distance limits X denoted herein are merely for illustrative purposes, and may be specific to design specifications. These numbers are not intended to be limiting of the teachings described herein, as other limits could be used depending upon design specifications. In the case that this wire-bond distance limit is not exceeded (No to decision D25A), the process continues to decision D25B.

In decision D25B, it is determined whether the maximum IR requirement has been met (satisfied). That is, decision D25B includes taking the determination of the IR drop from the off-chip pads to the intra-die pads to and determining whether that IR drop violates the max IR requirement for the chip die 22 (as dictated by the map). In the case that the maximum IR requirement is not violated (Yes to decision D25B), the process ends. In the case that the maximum IR requirement is violated (No to decision D25B), then in process P25, an additional pair of Vdd (30) and Gnd (32) intra-die bond pads are added to each side of the existing Vdd intra-die bond pads 30 and Gnd intra-die bond pads 32 along the band 24. This is illustrated, for example, in the chip die 33 of FIG. 9. It is further understood that process P25 may include rearranging the location of pads (e.g., Vdd (30) and Gnd (32) intra-die pads) to ensure that pads are uniformly spaced along the band 24, and that each adjacent pad is a distinct type (e.g., alternating Vdd and Gnd around band 24). Process P25 may further include the sub-process of bonding the additional Vdd and Gnd pads outward (as described in process P24). That is, the newly introduced Vdd (30) and Gnd (32) intra-die pads around band 24 will be bonded to double-bond high pads proximate the exterior of the die 22. Following completion of process P25, the process may loop back to process P23, where the IR map is again generated, and the maximum IR drop is calculated based upon the new pads and their respective locations.

Figure 10:
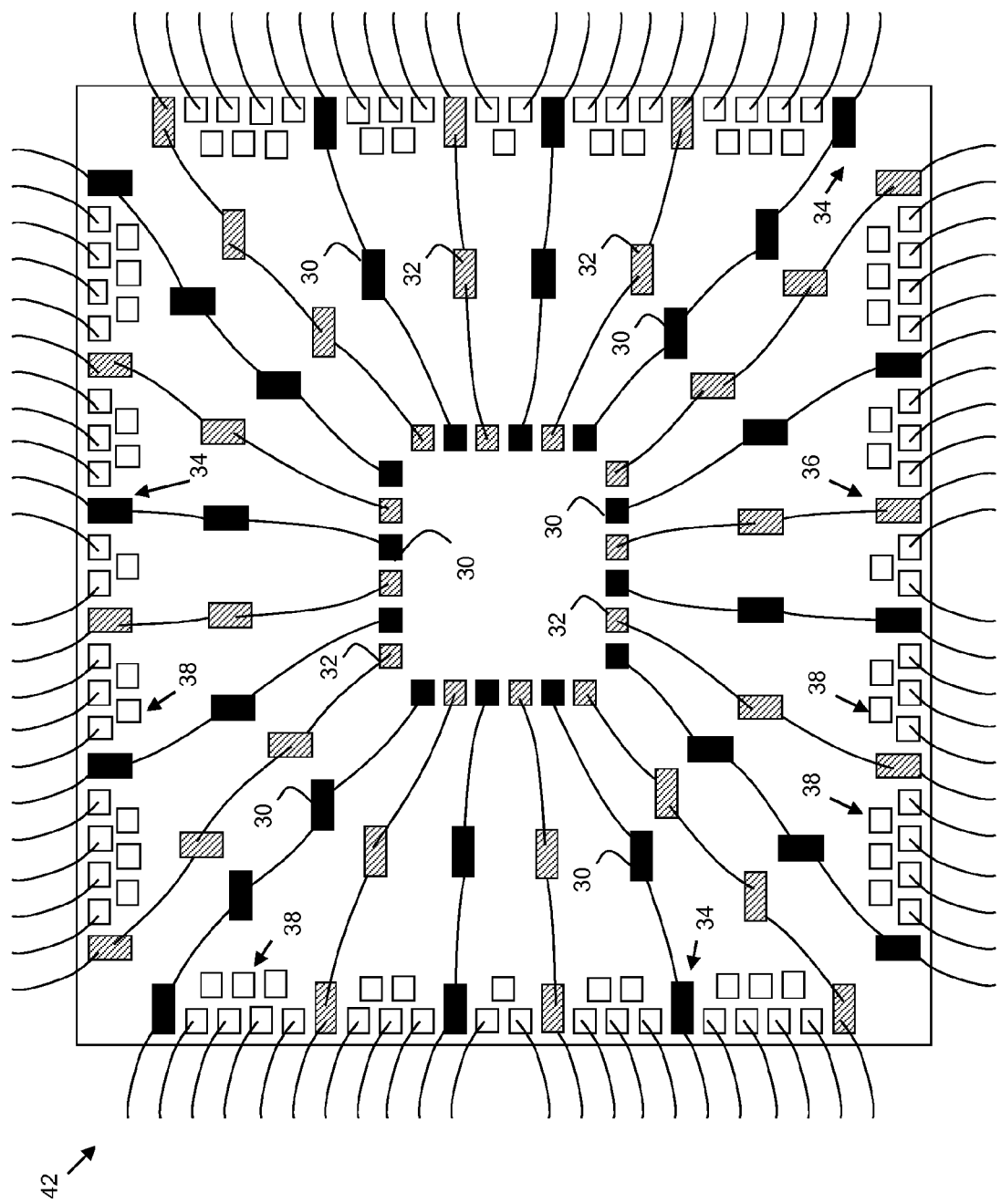
FIG. 10 shows an illustrative depiction of an integrated circuit chip die according to embodiments.
Figure 11:
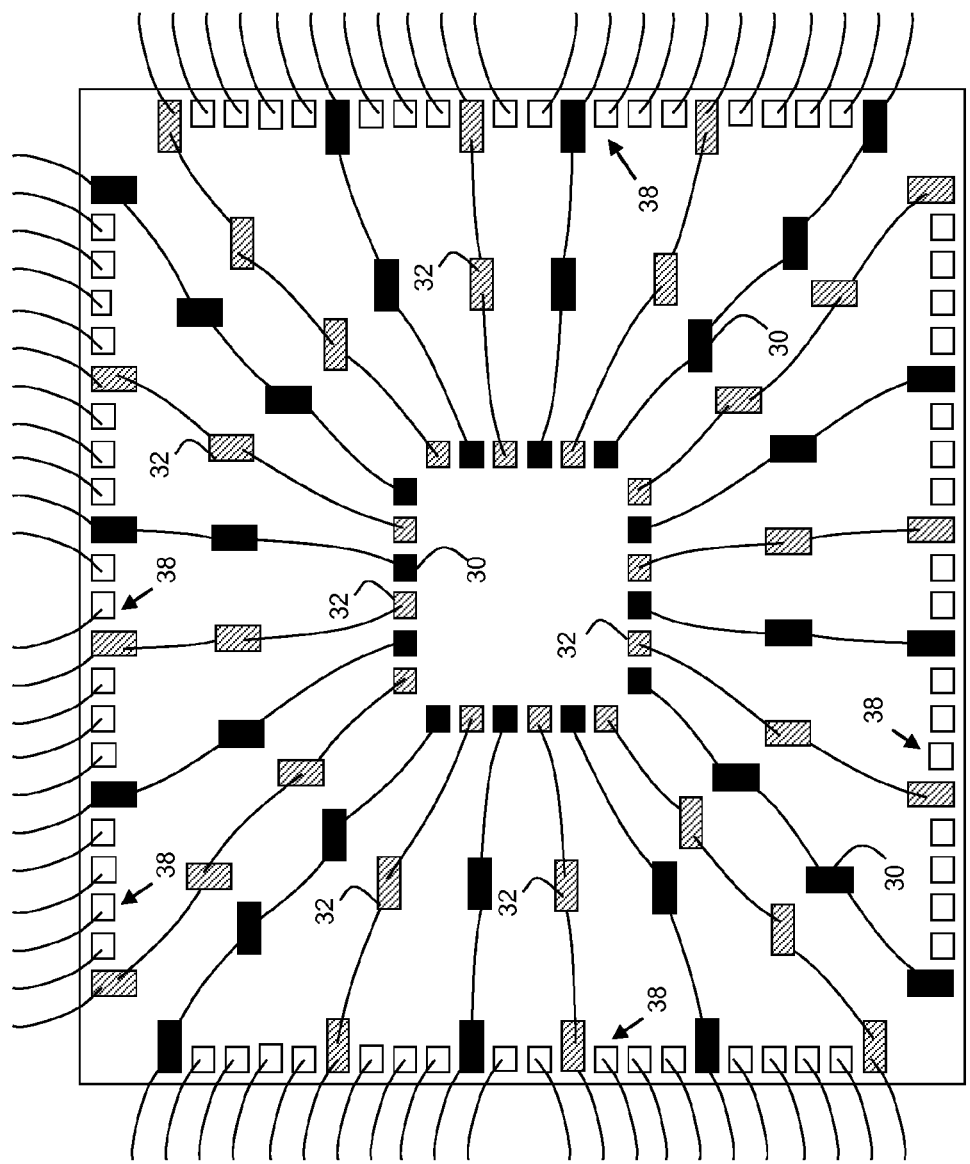
FIG. 11 shows an illustrative depiction of an integrated circuit chip die according to embodiments.

Returning to decision D25A, in the case that this wire-bond distance limit is exceeded (Yes to decision D25A), then in process P26 the bond distance between any path is reduced by inserting additional wire-bond pads in between the intra-die pads 30, 32 and the off-chip pads 34, 36, and bonding the additional pads along the path from the chip edge to the band 24. This is illustrated in FIGS. 10-11, which respectively show staggered additional pads (in chip die 42 of FIG. 10) and in-line additional pads (in chip die 52 of FIG. 11). Both figures show additional intra-die pads 30, 32 along paths between the original intra-die pads 30, 32 along band 24 (FIG. 6) and those off-chip pads 34, 36 proximate the perimeter of the chip die. However, FIG. 10 illustrates a chip die 42 including staggered off-chip pads 38 interposed between an outer level of off-chip pads 38 and intra-die pads 30, 32. In contrast to the chip die 42 of FIG. 10, FIG. 11 shows a chip die 52 including a single peripheral level of off-chip pads 38. Use of staggered versus in-line peripheral pads may be determined based upon the input/output (I/O) requirements of the chip design. Staggered in-line peripheral pads (e.g., staggered off-chip pads 38 of FIG. 10) allow for more I/O connections to the chip, but may introduce additional restraints with the additional pads. Typically, in a staggered design, nearly all power and ground I/O connections would be placed in the outer row (or peripheral pads 38, FIG. 10). It is understood that while one row of staggered pads 38 is shown in FIG. 10, additional rows (e.g., two, three, four, etc.) may be placed similarly as the first row of staggered pads 38 shown in FIG. 10. Following completion of process P26, the process may loop back to process P23, where the IR map is again generated, and the maximum IR drop is calculated based upon the new intra-die pads and their respective locations.

Figure 12:
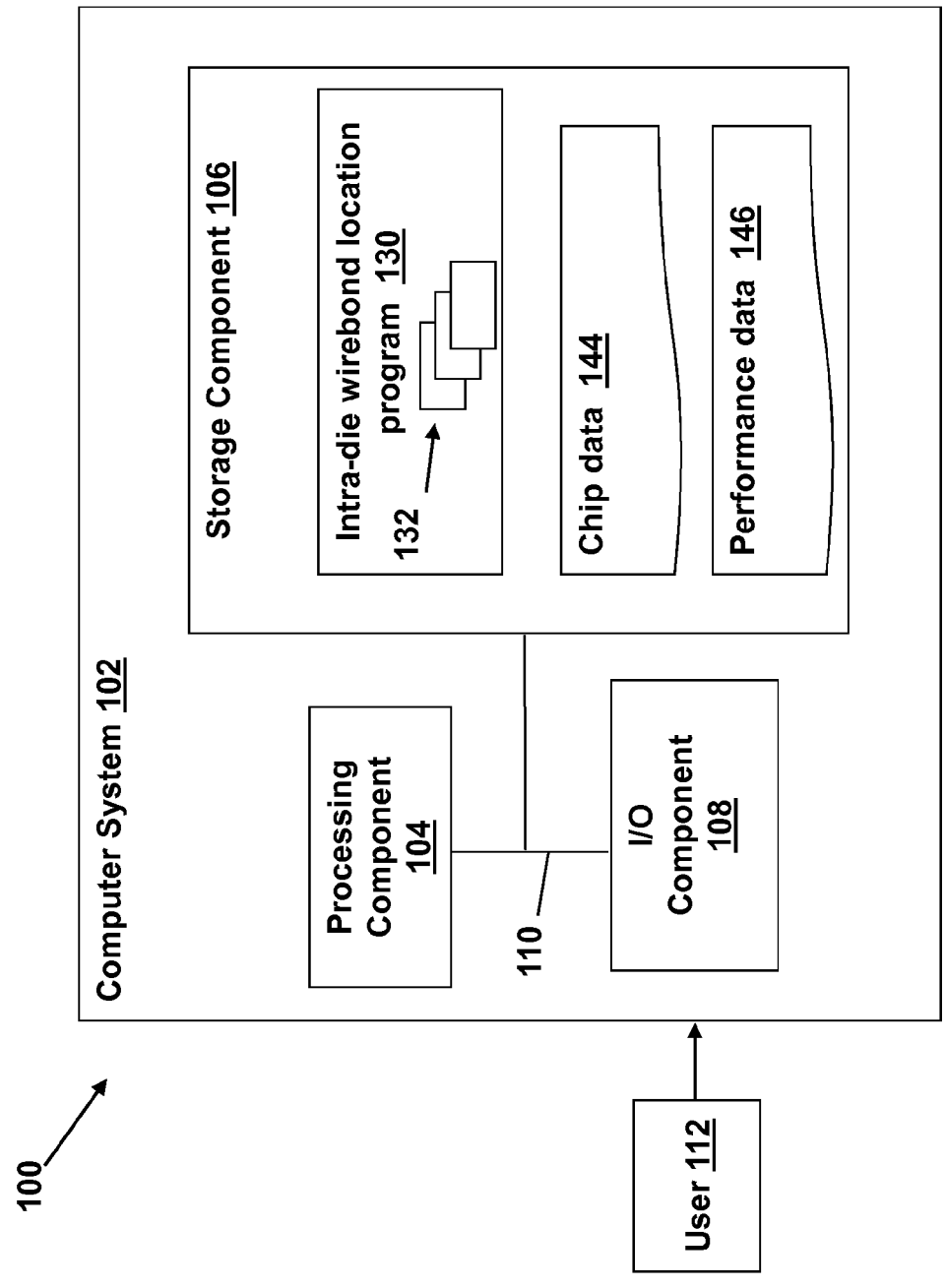
FIG. 12 shows an illustrative environment including an intra-die wirebond location program according to embodiments.

FIG. 12 depicts an illustrative environment 100 for determining intra-die wirebond placement locations according to an embodiment. To this extent, the environment 100 includes a computer system 102 that can perform a process described herein in order to determining intra-die wirebond placement locations in an integrated circuit layout. In particular, the computer system 102 is shown as including an intra-die wirebond location program 130, which makes computer system 102 operable to handle determining intra-die wirebond locations in an integrated circuit layout by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the intra-die wirebond location program 130, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a human user 112 to interact with the computer system 102 and/or one or more communications devices to enable a system user 112 to communicate with the computer system 102 using any type of communications link. To this extent, the intra-die wirebond location program 130 can manage a set of interfaces (e.g., graphical user interface(s), application program interface, etc.) that enable human and/or system users 112 to interact with the intra-die wirebond location program 130. Further, the intra-die wirebond location program 130 can manage (e.g., store, retrieve, create, manipulate, organize, present, etc.) data, such as chip data (e.g., chip dimensions, spacings, tolerances, etc.) 144 and/or performance data (e.g., IR drop requirements, voltages, timing requirements, etc.) 146, etc., using any solution.

In any event, the computer system 102 can comprise one or more general purpose computing articles of manufacture (e.g., computing devices) capable of executing program code, such as the intra-die wirebond location program 130, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the intra-die wirebond location program 130 can be embodied as any combination of system software and/or application software.

Further, the intra-die wirebond location program 130 can be implemented using a set of modules 132. In this case, a module 132 can enable the computer system 102 to perform a set of tasks used by the intra-die wirebond location program 130, and can be separately developed and/or implemented apart from other portions of the intra-die wirebond location program 130. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of intra-die wirebond location program 130 fixed thereon (e.g., one or more modules 132). However, it is understood that the computer system 102 and intra-die wirebond location program 130 are only representative of various possible equivalent computer systems that may perform a process described herein. To this extent, in other embodiments, the functionality provided by the computer system 102 and intra-die wirebond location program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as target data (e.g., target critical dimension data, target control structure data, etc.) 144 and/or mask map data (e.g., delta map data, mask control structure data) 146 using any solution. For example, the computer system 102 can generate and/or be used to chip data 144 and/or performance data 146, retrieve chip data 144 and/or performance data 146, from one or more data stores, receive chip data 144 and/or performance data 146, from another system, send chip data 144 and/or performance data 146 to another system, etc.

While shown and described herein as a method and system for correcting a mask deviation, it is understood that aspects of the invention further provide various alternative embodiments. For example, in one embodiment, the invention provides a computer program fixed in at least one computer-readable medium, which when executed, enables a computer system to determine a lithographic set point. To this extent, the computer-readable medium includes program code, such as the intra-die wirebond location program 130 (FIG. 12), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the intra-die wirebond location program 130 (FIG. 12), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 102 (FIG. 12), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method of determining intra-die wirebond pad placement locations in an integrated circuit (IC) die, the method comprising:
   generating a dividing band in the IC die, the dividing band dividing the IC die into a first region and a second region;
   determining a voltage drop across the first region and a voltage drop across the second region;
   comparing the voltage drop across the first region with the voltage drop across the second region; and
   in response to the voltage drop across the first region not being equal to the voltage drop across the second region, iteratively performing the following:
      moving the dividing band to a new location within the IC die to form a new first region and a new second region;
      determining a voltage drop across the new first region and a voltage drop across the new second region; and
      comparing the voltage drop across the new first region and the new second region until the voltage drop across the new first region is approximately equal to the voltage drop across the new second region.

2. The computer-implemented method of claim 1, further comprising designating the dividing band as a placement location for wire bond pads.

3. The computer-implemented method of claim 2, wherein the wire bond pads are ground wire bond pads or source wire bond pads.

4. The computer-implemented method of claim 1, further comprising:
   in response to determining the voltage drop across the new first region is approximately equal to the voltage drop across the new second region, performing the following:
      determining whether the dividing band is approximately greater than a threshold distance from a chip edge; and
      generating a second dividing band farther from a center of the IC die in the IC die, the second dividing band dividing the new second region into a first sub-region and a second sub-region.

5. The computer-implemented method of claim 4, further comprising
   determining a voltage drop across the first region, the first sub-region and the second sub-region, respectively;
   comparing the voltage drop across the first region with the voltage drop across the first sub-region and the voltage drop across the second sub-region; and
   in response to the voltage drop across the first region, first sub-region and second sub-region not being equal to one another, iteratively performing the following:
      moving at least one of the dividing band and the second dividing band to a new location within the IC die to form a subsequent first region, a new first sub-region and a new second sub-region;
      determining a voltage drop across the subsequent first region, the new first sub-region and the new second sub-region, respectively; and
      comparing the voltage drop across the subsequent first region, the voltage drop across the new first sub-region and the voltage drop across the new second sub-region until the voltage drops across the subsequent first region, a new first sub-region and a new second sub-region are approximately equal to one another.

6. The computer-implemented method of claim 4, wherein the determining of whether the dividing band is approximately greater than a threshold distance from a chip edge is performed by determining a straight-line distance from a corner of an outermost portion of the dividing band to a corner of the chip edge.

7. A computer system comprising:
   at least one computing device configured to determine intra-die wirebond pad placement locations in an integrated circuit (IC) die by performing actions comprising:
      generating a dividing band in the IC die, the dividing band dividing the IC die into a first region and a second region;
      determining a voltage drop across the first region and a voltage drop across the second region;
      comparing the voltage drop across the first region with the voltage drop across the second region; and
      in response to the voltage drop across the first region not being equal to the voltage drop across the second region, iteratively performing the following:
         moving the dividing band to a new location within the IC die to form a new first region and a new second region;
         determining a voltage drop across the new first region and a voltage drop across the new second region; and
         comparing the voltage drop across the new first region and the new second region until the voltage drop across the new first region is approximately equal to the voltage drop across the new second region.

8. The computer system of claim 7, further comprising designating the dividing band as a placement location for wire bond pads.

9. The computer system of claim 8, wherein the wire bond pads are ground wire bond pads or source wire bond pads.

10. The computer system of claim 7, further comprising:
    in response to determining the voltage drop across the new first region is approximately equal to the voltage drop across the new second region, performing the following:
       determining whether the dividing band is approximately greater than a threshold distance from a chip edge; and
       generating a second dividing band farther from a center of the IC die in the IC die, the second dividing band dividing the new second region into a first sub-region and a second sub-region.

11. The computer system of claim 10, further comprising determining a voltage drop across the first region, the first sub-region and the second sub-region, respectively;

comparing the voltage drop across the first region with each of the voltage drops across the first sub-region and the second sub-region; and in response to the voltage drop across the first region, the voltage drop across the first sub-region and the voltage drop across the second sub-region not being equal to one another, iteratively performing the following:

moving at least one of the dividing band and the second dividing band to a new location within the IC die to form a subsequent first region, a new first sub-region and a new second sub-region;

determining a voltage drop across the subsequent first region, a voltage drop across the new first sub-region and a voltage drop across the new second sub-region; and comparing the voltage drop across the subsequent first region, the voltage drop across the new first sub-region and the voltage drop across the new second sub-region until the voltage drops across the subsequent first region, a new first sub-region and a new second sub-region are approximately equal to one another.

12. The computer system of claim 10, wherein the determining of whether the dividing band is approximately greater than a threshold distance from a chip edge is performed by determining a straight-line distance from a corner of an outermost portion of the dividing band to a corner of the chip edge.

13. The computer system of claim 7, wherein the IC die represents one quarter of a complete IC die.

14. A computer program comprising program code embodied in at least one non-transitory computer-readable medium, when executed, enables a computer system to perform a method of determining intra-die wirebond pad placement locations in an integrated circuit (IC) die, the method comprising:

generating a dividing band in the IC die, the dividing band dividing the IC die into a first region and a second region;

determining a voltage drop across the first region and a voltage drop across the second region;

comparing the voltage drop across the first region with the voltage drop across the second region; and in response to the voltage drop across the first region not being equal to the voltage drop across the second region, iteratively performing the following:

moving the dividing band to a new location within the IC die to form a new first region and a new second region;

determining a voltage drop across the new first region and a voltage drop across the new second region; and comparing the voltage drop across the new first region and the new second region until the voltage drop across the new first region is approximately equal to the voltage drop across the new second region.

15. The computer program of claim 14, the method further comprising designating the dividing band as a placement location for wire bond pads.

16. The computer program of claim 15, wherein the wire bond pads are ground wire bond pads or source wire bond pads.

17. The computer program of claim 14, the method further comprising:

in response to determining the voltage drop across the new first region is approximately equal to the voltage drop across the new second region, performing the following:

determining whether the dividing band is approximately greater than a threshold distance from a chip edge; and generating a second dividing band farther from a center of the IC die in the IC die, the second dividing band dividing the new second region into a first sub-region and a second sub-region.

18. The computer program of claim 17, the method further comprising determining a voltage drop across the first region, the first sub-region and the second sub-region, respectively;

comparing the voltage drop across the first region with the voltage drop across the first sub-region and the voltage drop across the second sub-region; and in response to the voltage drop across the first region, first sub-region and second sub-region not being equal to one another, iteratively performing the following:

moving at least one of the dividing band and the second dividing band to a new location within the IC die to form a subsequent first region, a new first sub-region and a new second sub-region;

determining a voltage drop across the subsequent first region, a voltage drop across the new first sub-region and a voltage drop across the new second sub-region; and comparing the voltage drop across the subsequent first region, the voltage drop across the new first sub-region and the voltage drop across the new second sub-region until the voltage drops across the subsequent first region, the new first sub-region and the new second sub-region are approximately equal to one another.

19. The computer program of claim 17, wherein the determining of whether the dividing band is approximately greater than a threshold distance from a chip edge is performed by determining a straight-line distance from a corner of an outermost portion of the dividing band to a corner of the chip edge.

20. The computer program of claim 14, wherein the IC die represents one quarter of a complete IC die.

* * * * *